US010062950B2

United States Patent
Wang

(10) Patent No.: US 10,062,950 B2
(45) Date of Patent: Aug. 28, 2018

(54) HEAT DISSIPATER WITH AN ANTENNA STRUCTURE

(71) Applicant: Chih-Yuan Wang, Taipei (TW)

(72) Inventor: Chih-Yuan Wang, Taipei (TW)

( * ) Notice: Subject to any disclaimer, the term of this patent is extended or adjusted under 35 U.S.C. 154(b) by 80 days.

(21) Appl. No.: 15/133,232

(22) Filed: Apr. 20, 2016

(65) Prior Publication Data

US 2017/0309986 A1    Oct. 26, 2017

(51) Int. Cl.
  *H01Q 1/20* (2006.01)
  *H01Q 1/02* (2006.01)
  *H01Q 9/04* (2006.01)
  *H05K 7/20* (2006.01)

(52) U.S. Cl.
  CPC .............. *H01Q 1/02* (2013.01); *H01Q 9/04* (2013.01); *H05K 7/2039* (2013.01)

(58) Field of Classification Search
  CPC ..................................... H01Q 1/02; H01Q 9/04
  USPC .......................................................... 343/720
  See application file for complete search history.

(56) References Cited

U.S. PATENT DOCUMENTS

| 4,682,269 | A | * | 7/1987 | Pitasi | ............... | H05K 1/0209 165/185 |
| 4,771,294 | A | * | 9/1988 | Wasilousky | ........ | H01L 23/66 174/16.3 |
| 4,987,425 | A | * | 1/1991 | Zahn | ................... | H01Q 1/28 343/700 MS |
| 5,703,752 | A | * | 12/1997 | Woo | .................. | H05K 1/0204 361/704 |
| 5,831,830 | A | * | 11/1998 | Mahler | ................ | H01Q 1/02 165/185 |

* cited by examiner

*Primary Examiner* — Huedung Mancuso

(57) ABSTRACT

A heat dissipater with an antenna structure comprises a heat conductive portion capable of being contacted with a heat source of an electronic device for heat dissipation; and an antennal portion integrally formed to the heat conductive portion so as to form an integral body; and the antenna portion comprises at least one sheet body. A conductive layer is coated on a surface of the sheet body; in that the conductive layer can be connected to a conductive wire for being lead to the portable electronic device for signal receiving and transmission. The heat conductive portion 10 has the function of heat dissipation and the antenna portion 20 has the function of wireless transmission which are made integrally with a compact space so that the space in an portable electronic device for receiving the heat conductive device is sufficient to receiving the whole structure.

11 Claims, 4 Drawing Sheets

HEAT DISSIPATER WITH AN ANTENNA STRUCTURE

FIELD OF THE INVENTION

The present invention relates to heat dissipaters and antennas, and in particular to a portable heat dissipating sheet with antenna function of the present invention. The structure of the present invention is compact, small sizes, with small space for installation.

BACKGROUND OF THE INVENTION

Rapid development of current electronic devices causes that the portable electronic devices, such as mobile phones, tablet computers, etc. become necessary devices in daily life. However, the computer speeds are promoted continuously so that large amount of heat is produced. As a result, temperatures of these devices are increased to affect stability of the system. Generally thin heat dissipating sheets are installed in portable electronic devices for conduction of heat to outer sides. Further, batteries are also major resources of heat dissipation. Thin heat dissipation sheets are also used to conduct heats from batteries. The prior art heat dissipation sheets are made of high heat conductivity material, such as copper, aluminum alloys, graphite, ceramics, etc. However, these material occupy a large space and of the portable electronic device.

Furthermore, the prior art portable electronic devices generally have the function of communication, networking, NFC connections, etc. which need to be arranged with antennas for signal transmissions. In the prior art portable electronic devices, antennas and heat dissipation units are installed independently. Therefore the portable electronic device must leave spaces for receiving antenna and heat dissipater individually, but this will affect the installation of other electronic units. Moreover, the whole volume and thickness of the portable electronic device will be enlarged. This is in violation of the current trend of small size and compact structure of the portable electronic device.

SUMMARY OF THE INVENTION

Accordingly, objects of the present invention is to improve the defects in the prior art, the present invention provides a heat dissipater with an antenna structure, in that a heat conductive portion and the antenna portion are made integrally with a compact space so that the space in an portable electronic device for receiving the heat conductive device is sufficient to receiving the whole structure of the present invention. Thus, the present invention has the function of small size so that other elements in the portable electronic device can be installed easily and conveniently. As a result the volume and thickness of the portable electronic device can be reduced greatly.

To achieve above object, the present invention provides a heat dissipater with an antenna structure, comprising: a heat conductive portion capable of being contacted with a heat source of an electronic device for heat dissipation; and an antennal portion integrally formed to the heat conductive portion so as to form as an integral body; the antenna portion comprises at least one sheet body; and a conductive layer is coated on a surface of the sheet body; the conductive layer can be connected to a conductive wire for being lead to the portable electronic device for signal receiving and transmission. Material of the conductive layer is be selected from gold, silver, copper, or metals. The heat conductive portion may be made of copper, aluminum, graphite, or ceramics.

Furthermore, the antenna portion is not at the same plane of the heat conductive portion so as to promote the receiving and transmission effects of wireless signals.

BRIEF DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
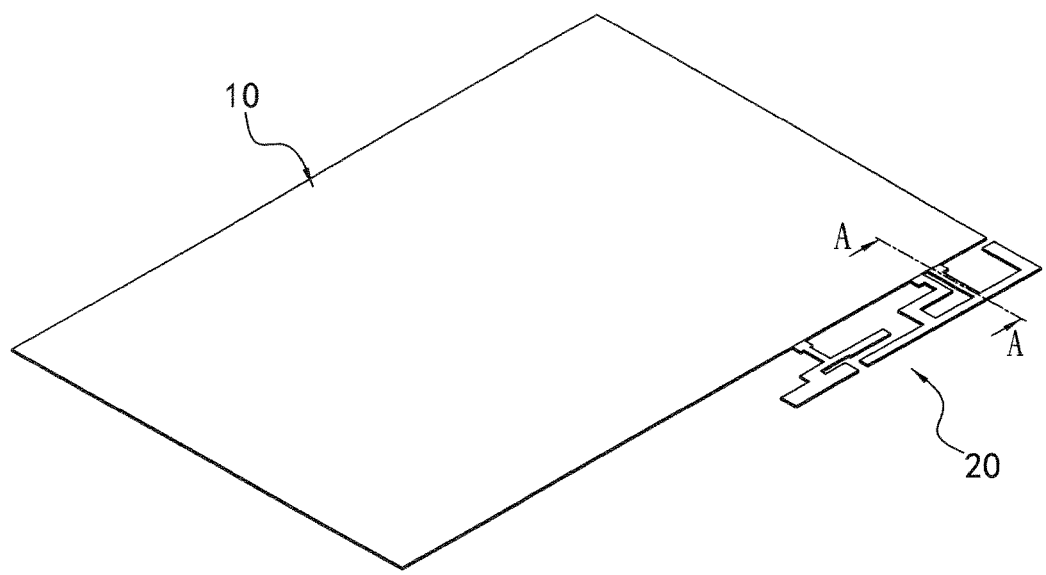
FIG. 1 is a perspective schematic view of the present invention.
Figure 2:
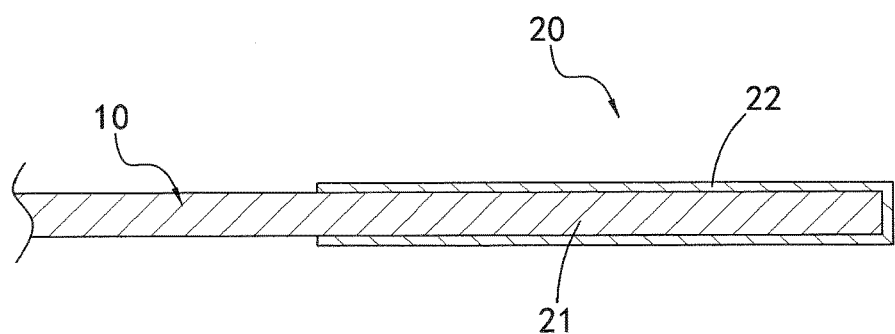
FIG. 2 is an enlarged schematic view along line A-A of FIG. 1 of the present invention.

With reference to FIGS. 1 and 2, the portable heat dissipating sheet with antenna function of the present invention is illustrated. The structure of the present invention is a thin sheet made of high heat conductivity material, such as copper, alumina alloy, graphite, ceramics, etc. The present invention comprises the following structures.

A heat conductive portion 10 is contacted with a heat source (not shown) of an electronic device (not shown) for heat dissipation quickly.

An antennal portion 20 is integrally formed to the heat conductive portion 10. The antenna portion 20 comprises at least one sheet body 21. A conductive layer 22 is coated on a surface of the sheet body 21. The conductive layer 22 can be connected to a conductive wire (not shown) for being lead to a mother board of a portable electronic device for signal receiving and transmission. Material of the conductive layer 22 may be selected from gold, silver, copper, or other metals. In the present invention, the conductive layer 22 can also be coated on a lateral side of the sheet body 21.

Figure 3:
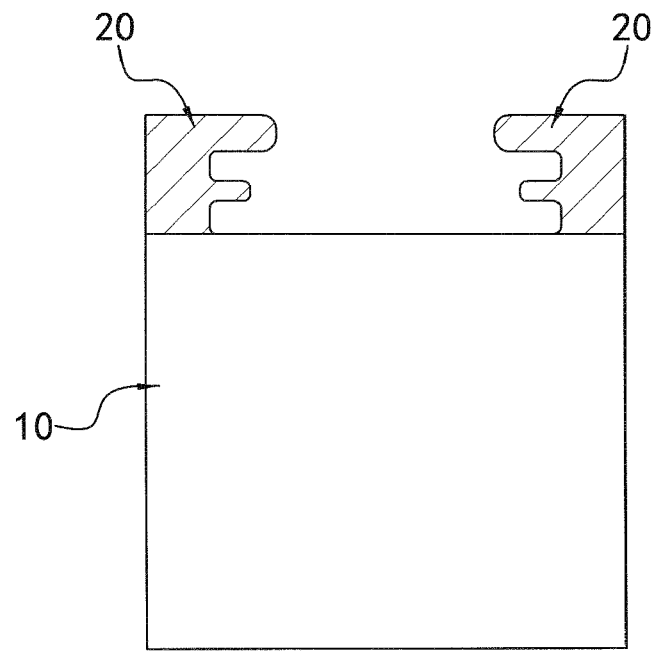
FIG. 3 shows one realization of the present invention.
Figure 3:
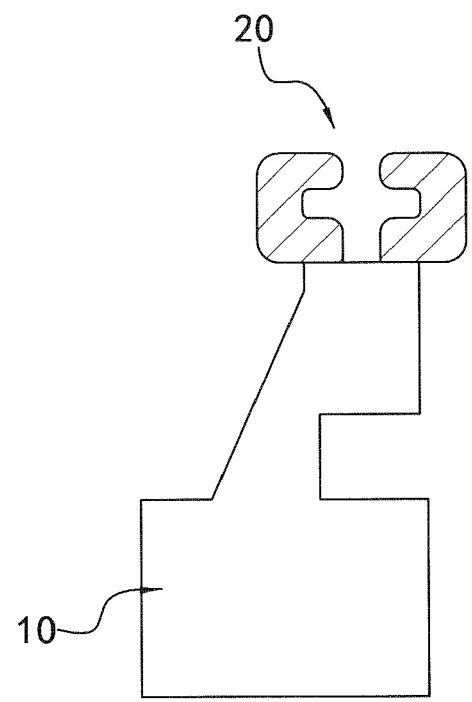

With reference to FIG. 3, it is illustrated that the shape of the heat dissipation sheet, and positions of the heat conductive portion 10 and the antenna portion 20 are suitable for the shape of the portable electronic device, the internal space thereof and the signal receiving and transmission quality.

Figure 4:
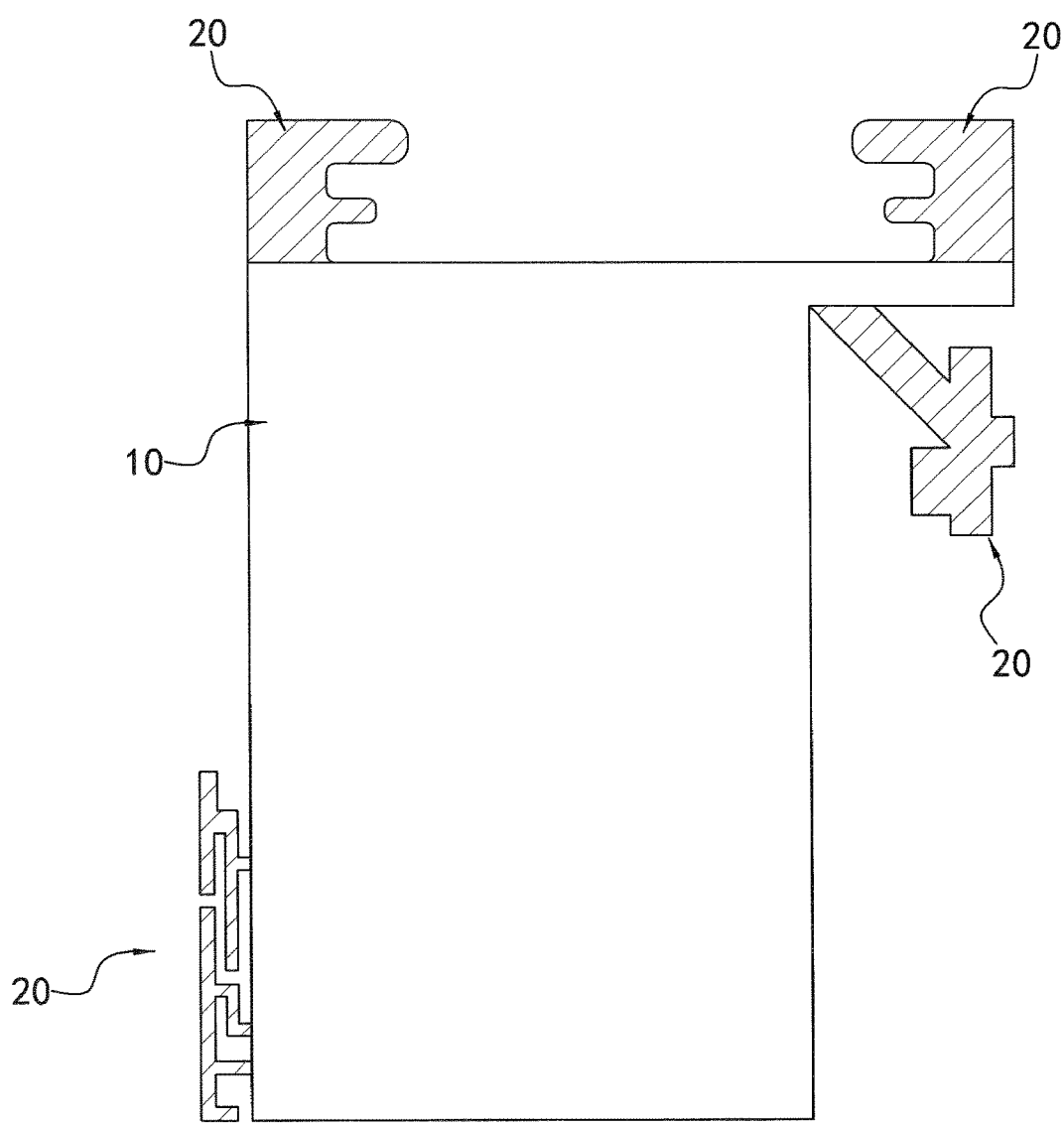
FIG. 4 shows another embodiment of the present invention.

With reference to FIG. 4, another embodiment of the present invention is illustrated. It is illustrated that the antenna portion 20 may contain two more partial portions which are formed at two or more different sides of the heat conductive portion 10.

Figure 5:
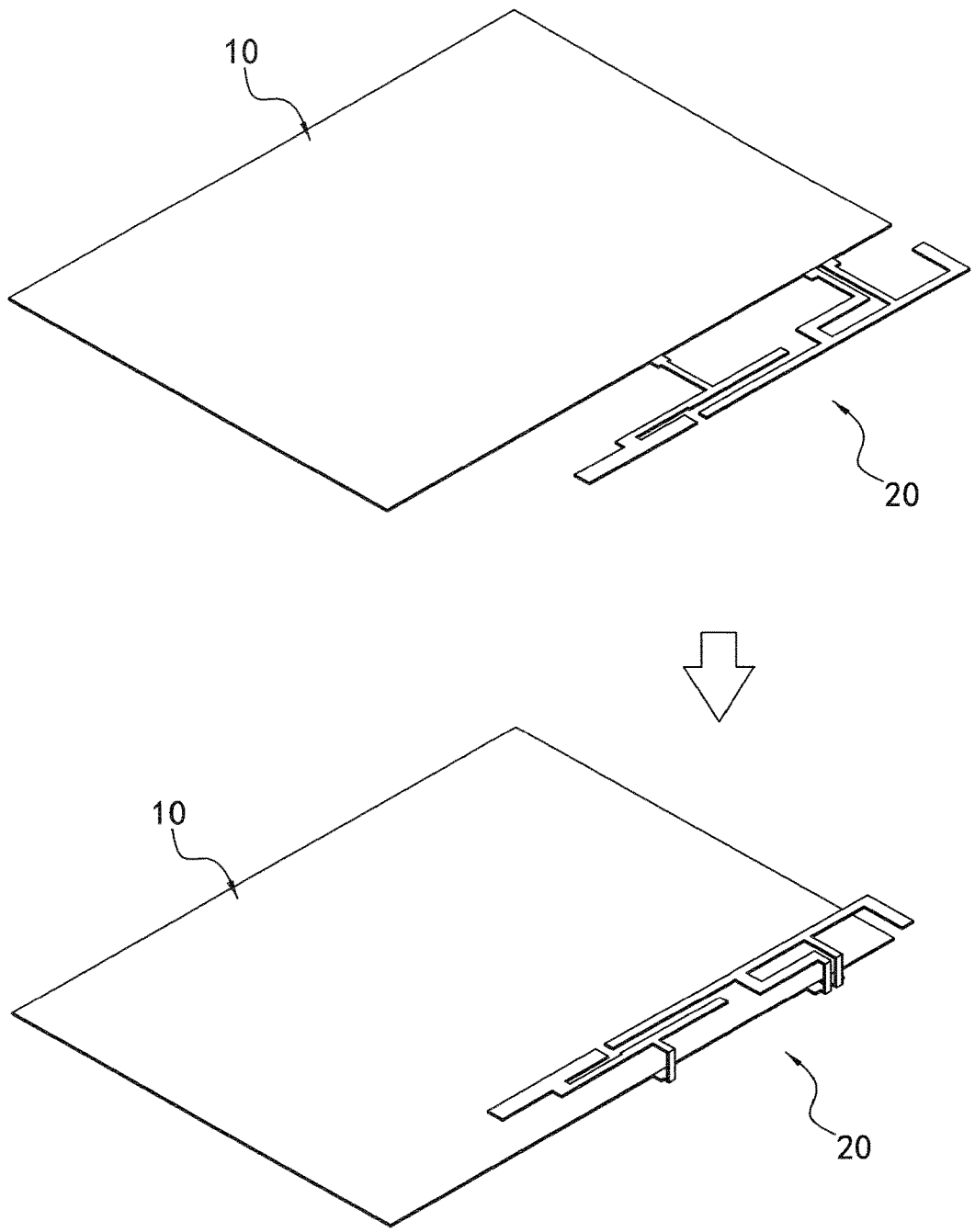
FIG. 5 shows a further embodiment of the present invention.

Referring to FIG. 5, a further embodiment of the present invention is illustrated. The antenna portion 20 is not at the same plane of the heat conductive portion 10 so as to promote the receiving and transmission effects of wireless signals.

Therefore, in the present invention, the heat conductive portion 10 has the function of heat dissipation and the antenna portion 20 has the function of wireless transmission which are made integrally with compact space so that the space in an portable electronic device for receiving the heat conductive device is sufficient to receiving the whole structure of the present invention. No extra space is necessary. Thus, the present invention has the function of small size so that other elements in the portable electronic device can be installed easily and conveniently. As a result the volume and thickness of the portable electronic device can be reduced greatly. This is matched to the current trend for the portable electronic devices.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipater with an antenna structure, comprising:
a heat conductive portion capable of being contacted with a heat source of an electronic device for heat dissipation; and
an antenna portion integrally formed to the heat conductive portion so as to form as an integral body; and the antenna portion comprises at least one sheet body, and
wherein the heat conductive portion has the function of heat dissipation and the antenna portion has the function of wireless transmission which are made integrally so that the space in an portable electronic device for receiving the heat conductive device is sufficient to receiving the heat conductive portion and the antenna portion; and
wherein the antenna portion contains two or more sub-portions which are formed at two or more different sides of the heat conductive portion.

2. The heat dissipater with an antenna structure as claimed in claim 1, wherein a conductive layer is coated on a surface of the sheet body; in that the conductive layer can be connected to a conductive wire for being lead to the portable electronic device for signal receiving and transmission.

3. The heat dissipater with an antenna structure as claimed in claim 1, wherein material of the conductive layer is selected from gold, silver, copper, or metals.

4. The heat dissipater with an antenna structure as claimed in claim 3, wherein the conductive layer is coated on a lateral side of the sheet body.

5. The heat dissipater with an antenna structure as claimed in claim 1, wherein the heat conductive portion and the antenna portion are formed of the same material.

6. The heat dissipater with an antenna structure as claimed in claim 5, wherein the heat conductive portion is made of copper.

7. The heat dissipater with an antenna structure as claimed in claim 5, wherein the heat conductive portion is made of aluminum.

8. The heat dissipater with an antenna structure as claimed in claim 5, wherein the heat conductive portion is made of graphite.

9. The heat dissipater with an antenna structure as claimed in claim 5, wherein the heat conductive portion is made of ceramics.

10. The heat dissipater with an antenna structure as claimed in claim 1, wherein positions of the heat conductive portion and the antenna portion are suitable for a shape, an internal space and the signal receiving and transmission quality of the portable electronic device.

11. The heat dissipater with an antenna structure as claimed in claim 1, wherein the antenna portion is not at the same plane of the heat conductive portion so as to promote the receiving and transmission effects of wireless signals.

* * * * *